(12) United States Patent
Fick et al.

(10) Patent No.: US 9,760,533 B2
(45) Date of Patent: Sep. 12, 2017

(54) FLOATING-GATE TRANSISTOR ARRAY FOR PERFORMING WEIGHTED SUM COMPUTATION

(71) Applicants: The Regents of The University of Michigan, Ann Arbor, MI (US); Isocline Engineering, LLC, Ann Arbor, MI (US)

(72) Inventors: Laura Fick, Ann Arbor, MI (US); David T. Blaauw, Ann Arbor, MI (US); Dennis Sylvester, Ann Arbor, MI (US); Michael B. Henry, Ann Arbor, MI (US); David Alan Fick, Ann Arbor, MI (US)

(73) Assignee: THE REGENTS ON THE UNIVERSITY OF MICHIGAN, Ann Arbor, MI (US)

( * ) Notice: Subject to any disclaimer, the term of this patent is extended or adjusted under 35 U.S.C. 154(b) by 63 days.

(21) Appl. No.: 14/459,577

(22) Filed: Aug. 14, 2014

(65) Prior Publication Data

US 2016/0048755 A1    Feb. 18, 2016

(51) Int. Cl.
| | |
|---|---|
| *G06N 3/06* | (2006.01) |
| *G06F 17/11* | (2006.01) |
| *G11C 16/10* | (2006.01) |
| *G06N 3/063* | (2006.01) |
| *G11C 7/10* | (2006.01) |

(52) U.S. Cl.
CPC .............. *G06F 17/11* (2013.01); *G06N 3/063* (2013.01); *G11C 7/1006* (2013.01); *G11C 16/10* (2013.01)

(58) Field of Classification Search
CPC ....................................................... G11C 16/10

USPC ...................................................... 365/185.05
See application file for complete search history.

(56) References Cited

U.S. PATENT DOCUMENTS 4,956,564 A * 9/1990 Holler ..................... G06N 3/063
                                                            326/36
5,055,897 A   10/1991 Canepa et al.
(Continued)

FOREIGN PATENT DOCUMENTS

| EP | 0469885 A2 | 2/1992 |
| EP | 0509796 A2 | 10/1992 |

(Continued)

OTHER PUBLICATIONS

Chris Diorio et al., "A High-Resolution Nonvolatile Analog Memory Cell," Proceedings of the 1995 IEEE International Symposium on Circuits and Systems, vol. 3, pp. 2233-2236 (1995).

(Continued)

*Primary Examiner* — Anthan Tran
*Assistant Examiner* — Mushfique Siddique
(74) *Attorney, Agent, or Firm* — Harness, Dickey & Pierce, P.L.C.

(57) ABSTRACT

A weighted sum is a key computation for many neural networks and other machine learning algorithms. Integrated circuit designs that perform a weighted sum are presented. Weights are stored as threshold voltages in an array of flash transistors. By putting the circuits into a well-defined voltage state, the transistors that hold one set of weights will pass current equal to the desired sum. The current flowing through a given transistor is unaffected by operation of remaining transistors in the circuit.

12 Claims, 9 Drawing Sheets

(56) References Cited

U.S. PATENT DOCUMENTS

| | | | | |
|---|---|---|---|---|
| 5,256,911 | A * | 10/1993 | Holler | G06N 3/0635 706/37 |
| 5,336,936 | A * | 8/1994 | Allen | G06N 3/063 326/44 |
| 5,530,275 | A * | 6/1996 | Widdershoven | G06N 3/063 257/236 |
| 5,537,512 | A * | 7/1996 | Hsia | G06N 3/0635 706/33 |
| 5,923,585 | A * | 7/1999 | Wong | G11C 16/12 365/185.03 |
| 6,154,157 | A * | 11/2000 | Wong | H03M 1/001 341/110 |
| 6,345,000 | B1 * | 2/2002 | Wong | G11C 16/08 365/185.05 |
| 6,937,523 | B2 * | 8/2005 | Eshel | G11C 16/28 365/185.18 |
| 8,436,413 | B2 | 5/2013 | Shrivatsava et al. | |
| 8,441,382 | B2 | 5/2013 | Mahajan et al. | |
| 2001/0053094 | A1 * | 12/2001 | Otsuka | G11C 16/08 365/185.23 |
| 2002/0154542 | A1 * | 10/2002 | Kasa | G11C 16/26 365/185.11 |
| 2005/0078514 | A1 * | 4/2005 | Scheuerlein | G11C 8/10 365/185.05 |
| 2007/0234097 | A1 * | 10/2007 | Nervegna | G06F 1/04 713/500 |
| 2008/0309530 | A1 * | 12/2008 | Baker | G11C 11/5642 341/136 |
| 2009/0083202 | A1 * | 3/2009 | Tanaka | G06N 3/063 706/15 |
| 2009/0265112 | A1 * | 10/2009 | Wilber | B82Y 10/00 702/19 |
| 2010/0259235 | A1 * | 10/2010 | Ozalevli | G05F 1/56 323/274 |
| 2012/0033491 | A1 * | 2/2012 | Shelton | G11C 16/10 365/185.2 |

FOREIGN PATENT DOCUMENTS

| | | |
|---|---|---|
| EP | 0570011 A1 | 11/1993 |
| EP | 0602163 A1 | 6/1994 |
| EP | 0768610 A1 | 4/1997 |
| WO | WO-90-04836 A1 | 5/1990 |
| WO | WO-93/25970 A1 | 12/1993 |
| WO | WO-95-31043 A2 | 11/1995 |
| WO | WO-96/14638 A1 | 5/1996 |
| WO | WO-2004040658 A1 | 5/2004 |

OTHER PUBLICATIONS

Piotr Dudek et al., "A CMOS General-Purpose Sampled-Data Analog Processing Element," IEEE Transactions on Circuits and Systems—II: Analog and Digital Signal Processing, vol. 47, No. 5, pp. 467-473, May 2000.

Russel D. Reed et al., "A Multiple-Input OTA Circuit for Neural Networks," IEEE Transactions on Circuits and Systems, vol. 36, No. 5, pp. 767-770, May 1989.

Tadashi Shibata et al., "A Functional MOS Transistor Featuring Gate-Level Weighted Sum and Threshold Operations," IEEE Transactions on Electron Devices, vol. 39, No. 6, pp. 1444-1455, Jun. 1992.

Seung-Hwan Song et al., "A Logic-Compatible Embedded Flash Memory for Zero-Standby Power System-on-Chips Featuring a Multi-Story High Voltage Switch and a Selective Refresh Scheme," IEEE Journal of Solid-State Circuits, vol. 48, No. 5, pp. 1302-1314, May 2013.

* cited by examiner

FIG. 11

FLOATING-GATE TRANSISTOR ARRAY FOR PERFORMING WEIGHTED SUM COMPUTATION

GOVERNMENT CLAUSE

This invention was made with government support under DGE1256260 awarded by the National Science Foundation, and FA8650-13-M-1650 awarded by the US Air Force/AFMC. The Government has certain rights in the invention.

FIELD

The present disclosure relates to integrated circuits that perform weighted sum computations using, for example, floating-gate transistors.

BACKGROUND

A common calculation performed in neural networks and machine learning algorithms is a weighted sum. This calculation takes a set of inputs ($x_i$), multiplies it by a set of weights ($w_i$), and sums those values to create a final result (z). This can be written as:

$$z = \sum_i x_i w_i$$

Although this a relatively simple equation, it is the basic computation step for most neural network designs and the inputs can number in the thousands, while the weights can number in the millions. Current software-based neural network designs are limited by the ability to perform this calculation, among other things. A "complete" neuron will perform this calculation, then perform a function on z to create the final neuron output (y). Typically the function on z is trivial compared to the weighted sum. Common examples include the rectified linear, binary threshold, and logistic neuron functions:

$$\text{Rectified Linear: } y = \begin{cases} z & \text{if } z > 0 \\ 0 & \text{otherwise} \end{cases}$$

$$\text{Binary Threshold: } y = \begin{cases} 1 & \text{if } z > 0 \\ 0 & \text{otherwise} \end{cases}$$

$$\text{Logistic: } y = \frac{1}{(1 + e^{-z})}$$

Neural networks and other machine learning algorithms typically apply multiple sets of weights to the same inputs. These weight sets are often called "filters", and function to detect a pattern in the input data. Many neural networks and machine learning algorithms function by searching the inputs for patterns and then providing the results to another stage of processing.

Due to the large number of weights that need to be stored in these systems, memory management is a key technical challenge. Upwards of millions or even billions of weights are needed for processing the data. Continuously loading and reloading these weights becomes a bottleneck in terms of power, physical area of implementation, and performance. Previous systems which used flash memory to store the weights also used structures that could use one or a few weights at a time, used inefficient architectures, performed very slowly, and/or had limited capability. Therefore, it is desirable to develop an integrated circuit design that mitigates these issues.

This section provides background information related to the present disclosure which is not necessarily prior art.

SUMMARY

This section provides a general summary of the disclosure, and is not a comprehensive disclosure of its full scope or all of its features.

An integrated circuit is provided that performs weighted sum computations. The circuit includes: a plurality of floating-gate transistors interconnected and arranged into subsets of transistors. For each subset of transistors, one of a source terminal or a drain terminal for each floating-gate transistor in a given subset of transistors is electrically connected together at a select node and the other of the source terminal and the drain terminal for each floating-gate transistor in the given subset of transistors is electrically connected together at an output node. The threshold voltage of the floating-gate transistors varies amongst the plurality of floating-gate transistors. Each floating-gate transistor in the plurality of floating-gate transistors passes a current having a predetermined value that is a function of the voltage between the gate terminal and source terminal, its threshold voltage, and a voltage between its source terminal and its drain terminal. By maintaining predetermined values for each of these voltages for each transistor, the circuit is configured such that the current flowing through a given floating-gate transistor is unaffected by operation of remainder of the floating-gate transistors.

The circuit further includes a control circuit, an input circuit and an output circuit. The control circuit is electrically connected to the select node for each subset of transistors and operates to selectively activate a given subset of floating-gate transistors in the plurality of floating-gate transistors by maintaining a constant voltage on that node. The input circuit is electrically connected to each floating-gate transistor and operates to activate one or more floating-gate transistors in the given subset of floating-gate transistors by maintaining a constant voltage on that node. The output circuit is electrically connected to the output node of each subset of transistors at a common output node and operates to maintain a constant voltage at the common output node and generate an output which is correlated to current that is being sourced collectively by the plurality of floating-gate transistors.

In one aspect, the input circuit is electrically coupled to a gate terminal of each floating-gate transistor and operates to bias each floating-gate transistor individually.

In another aspect, the circuit has a plurality of inputs electrically coupled to the input circuit, such that each input is electrically coupled across the subset of transistors to a gate terminal of one floating-gate transistor in each subset of transistors.

In yet another aspect, the control circuit selectively activates the given subset of floating-gate transistors by forming a non-zero voltage between the source terminal and drain terminal of each transistor in the given subset of floating-gate transistors. More specifically, the control circuit selectively activates the given subset of floating-gate transistors by applying one of two voltages to the select node for the given subset of floating-gate transistors, where a first voltage causes current to flow through the floating-gate transistors away from the select node and a second voltage causes current to flow through the floating-gate transistors towards from the select node.

The circuit may include a multiplexer having a plurality of inputs and an output, such that inputs of the multiplexer are selectively coupled to the output nodes of each subset of transistors and the output of the multiplexer is electrically connected to the common output node. In some embodiments, the select nodes for each subset of transistors are electrically coupled together at a common select node.

In other embodiments, the circuit is comprised of an array of current source modules interconnected and arranged into rows and columns, where each current source module includes at least one field effect transistor. For each row of current source modules, one of a source terminal or a drain terminal for each current source module in the row of current source modules is electrically connected together at a select node and the other of the source terminal and the drain terminal for each current source module in the row of current source modules is electrically connected together at an output node. Each current source module generally includes a charge receptacle electrically isolated but capacitively coupled to a channel region of the transistor.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
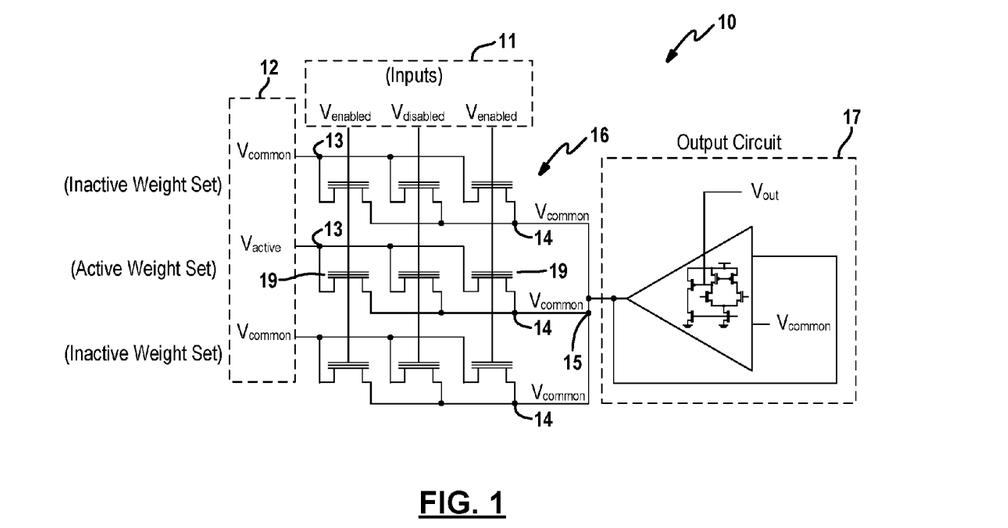
FIG. 1 is a schematic of an example embodiment of a weighted sum circuit arrangement employing a binary input.

FIG. 1 depicts an example embodiment of the weighted sum circuit arrangement 10. The circuit arrangement 10 is comprised generally of an input circuit 11, a control circuit 12, an output circuit 17 and a plurality of floating-gate transistors 16. For simplicity, the floating-gate transistors are arranged in a three by three array although other arrangements are contemplated by this disclosure. Likewise, the arrangement may include more or fewer floating-gate transistors.

In the example embodiment, the floating-gate transistors 16 are interconnected such that a source terminal for each floating-gate transistor in a row of floating-gate transistors (i.e., subset) is coupled together at a select node 13; whereas, a drain terminal for each floating-gate transistor in the row of floating-gate transistors is electrically connected together at a output node 14 which are in turn coupled together at a common output node 15. Depending on the transistor type, in other embodiments, the source terminals of the floating-gate transistors are coupled to the output node 14 and the drain terminals of the floating-gate transistors are coupled to the select node 13. While reference is made throughout this description to floating-gate transistors, it is understood that the floating-gate transistors may be replaced more generically with a current source module as will further described below.

Each row in the array represents a weight set which can be selected. Select floating-gate transistors in a given row are activated by the input circuit 11. That is, a subset of the weight set is then selected via the gate terminals of the floating-gate transistors, where the weight is enabled by an input representing one and disabled by an input representing zero. The weights are stored as threshold voltages for each of the floating-gate transistors and will change the current that each transistor passes. Depending of the circuit arrangement, it is understood that different voltages may be used to represent input values one and zero. Because this variant allows only inputs that represent 1 or 0, it is referred to as the "binary-input" array design. Although the inputs are binary, the weights and the output can represent real-valued numbers.

To bias the circuit, the control circuit 12 is electrically connected to the select node 13 for each row and operates to selectively activate a given row. More specifically, the non-common source/drain terminal of the transistor is set to $V_{active}$ and the common source/drain terminal is set to $V_{common}$ such that a known, non-zero voltage is formed across the source/drain terminals of the transistors in the activated row. Common and non-common refer to whether the node is connected to the output circuit, which connects between rows, as opposed to the node connected to input circuit, which shares only within a row. Transistors to rows not being used in the current calculation have both source/drain terminals set to $V_{common}$ so that no current is passed.

To select from among the transistors in a row, the gates of the transistors is set to $V_{enabled}$ or $V_{disabled}$ depending if the input is a 1 or a 0, respectively. For the transistors in the enabled weight set, a voltage forms across the source/drain terminals, and the transistor is activated based on input data which sets the gate. The weight is programmed into the threshold voltage of the device, where a high enough threshold disables the transistor and represents a weight of zero. As the threshold voltage decreases, the amount of current passed increases which represents a larger weight. It is readily understood that the threshold voltages vary amongst the floating-gate transistors within the array so that each floating-gate transistor may have its own weight.

With continued reference to FIG. 1, the middle row of weights is activated by setting $V_{active}$ on the active source/drain terminals, while the inactive weight sets have $V_{common}$ set on the non-common source/drain terminals. The output circuit 17 maintains $V_{common}$ on the common source/drain terminals by sourcing current to/from the array. Inputs having a value of one are labeled as $V_{enabled}$, while inputs having a value of zero are labeled as $V_{disabled}$. Thus, in the diagram, the two transistors labeled 19 are carrying current, and the current that they are carrying is set by the weights stored as threshold voltages on the floating-gate transistors.

The output circuit 17 is electrically coupled to the common output node 15 and operates to maintain voltage constant at the common output node. Specifically, the output circuitry 17 must source or sink current equal to the current drawn by those two transistors in order to maintain the correct voltage. The speed at which this occurs is not important. That is, the common output node 15 can be allowed to change while the output circuitry 17 searches for the right amount of current to source. The output circuit 17 also needs to provide some sort of discernable output that indicates the amount of current being supplied to the common output node 15 (i.e., weighted sum value). The output could be a voltage, current, digital code, or any other sort of measurable value such as resistance or capacitance.

In one example embodiment, the output circuit 17 is further defined as an operational transconductance amplifier (OTA) with a monitored internal node, which is the voltage controlling the output current. Other embodiments for the output circuit 17 may include digitally controlled current sources enabled via a finite state machine which contains a comparator; an OTA in feedback mode that has a resistor in the feedback path such that the current passed through the resistor develops a voltage, a high-speed pulse-width modulated current source where the output is the pulse-width modulated signal or a transformation of that signal, or some combination thereof. It is envisioned that any circuit that compares the common node voltage and makes some sort of decision, in continuous time or in discrete time, to add or remove more charge may be used as output circuit 17.

A variant of the output circuit 17 can include an offset current source attached to the common line—this is a circuit that provides a particular amount of current in order to shift the effort level provided by the output circuitry. As a result, the output circuitry may need to only either source or sink current regardless of calculation result, instead of possibly alternating between sourcing current and sinking current depending on calculation result (in the case where negative weights are allowed, as discussed in the following paragraph). The offset current may be tunable either digitally or with an analog signal such as a current or a voltage. The output signal may also have an adjustable gain. In the case of the OTA with the feedback resistor, the gain could be adjusted by adjusting the resistance in the feedback such that a larger or smaller voltage is developed across the resistor. In the case of the OTA with the monitored internal node, the gain could be adjusted by adjusting the strength of the output driver so that a larger or smaller adjustment of the monitored internal node is required to achieve the same effect.

Figure 2:
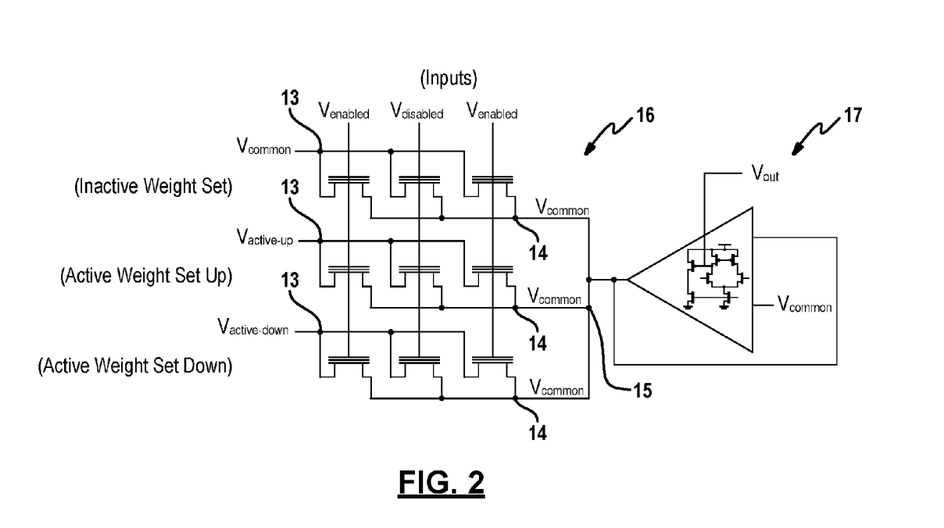
FIG. 2 is a schematic of an example embodiment of the weighted sum circuit arrangement in FIG. 1 implementing positive and negative weights.

In one variant of this embodiment, negative weights can be implemented as shown in FIG. 2. For example, by using two different $V_{active}$ voltages with opposing properties, weights in the second row may be added while weights in the third row are subtracted from the sum. In other words, the current flows in one direction for one voltage and the other direction for the other voltage. This makes it so that the output circuit 17 may need to supply positive current or negative current to the common line, which allows a greater variety of computational output.

Figure 3:
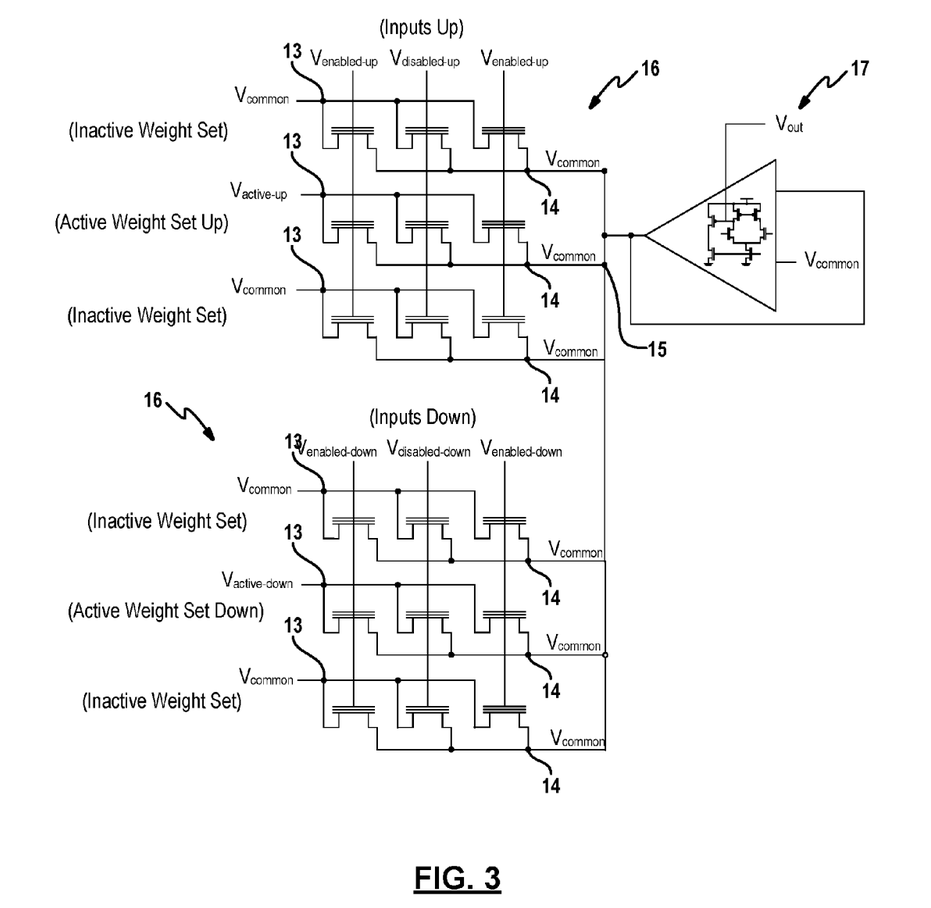
FIG. 3 is a schematic of an example embodiment of the weighted sum circuit arrangement in FIG. 1 implementing separate arrays for positive and negative weights.

Alternatively, the up-weights and down-weights can be implemented in separate arrays to achieve the same effect as shown in FIG. 3. This has the advantage that separate $V_{enabled}$ voltages can be generated for up-weights versus down-weights; using separate voltages may be necessary to have matching current ranges for the two types of weights. A similar strategy could be implemented to create "large" weights and "small" weights by adjusting $V_{active}$ and/or $V_{enabled}$ to change the range of currents for a subset of transistors, either in the same array or in multiple arrays connected to the same output.

Figure 4:
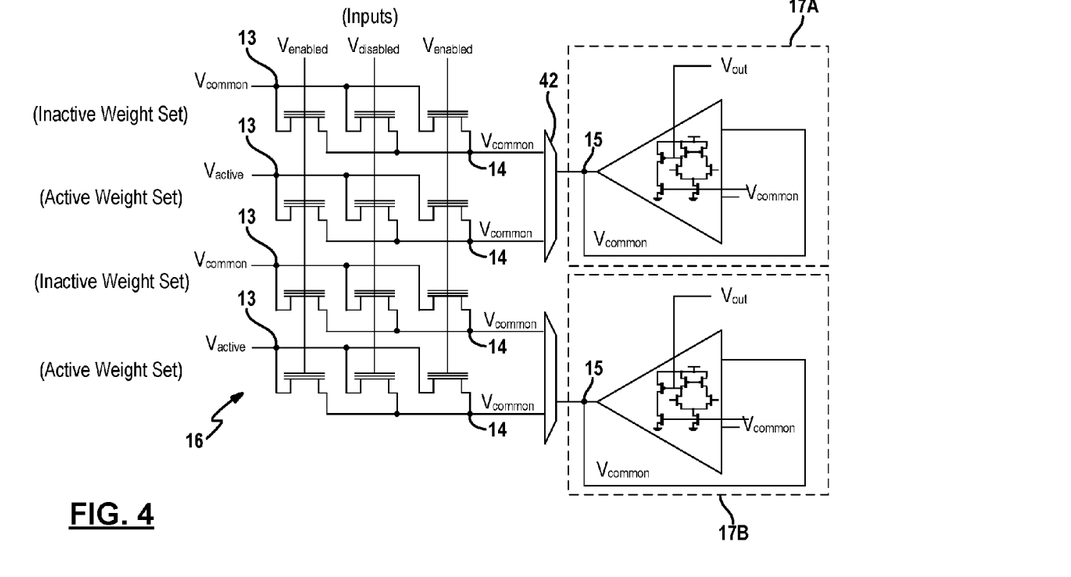
FIG. 4 is a schematic of an example embodiment of the weighted sum circuit arrangement in FIG. 1 implementing multiple read-out circuits.

In another variant, a multiplexer 42 can be added between the array of floating-gate transistors 16 and the output circuit 17 as shown in FIG. 4. Inputs of the multiplexer are selectively coupled to the output nodes 14 of each row of transistors and the output of the multiplexer is electrically connected to a common output node 15. In this way, a reduced selection of rows can be connected to the output circuit 17 at any given time. This strategy reduces the amount of capacitance on the common line which can improve performance and reduce energy consumption per calculation.

Additionally or alternatively, multiple instantiations of the output circuit 17 can be used so that multiple rows in the same array can be activated and computed at the same time. In this example, the top two rows of a four-by-three array are connected to one output circuit 17A and the bottom two rows are connected to another output circuit 17B. Thus, the common line is broken between the output circuit instantiations so that they are not driving the same line. It is understood that the array may be interfaced with a different number of instantiations of the output circuit ranging from every weight set could be computed simultaneously to just one weight set being computed at a time.

Figure 5:
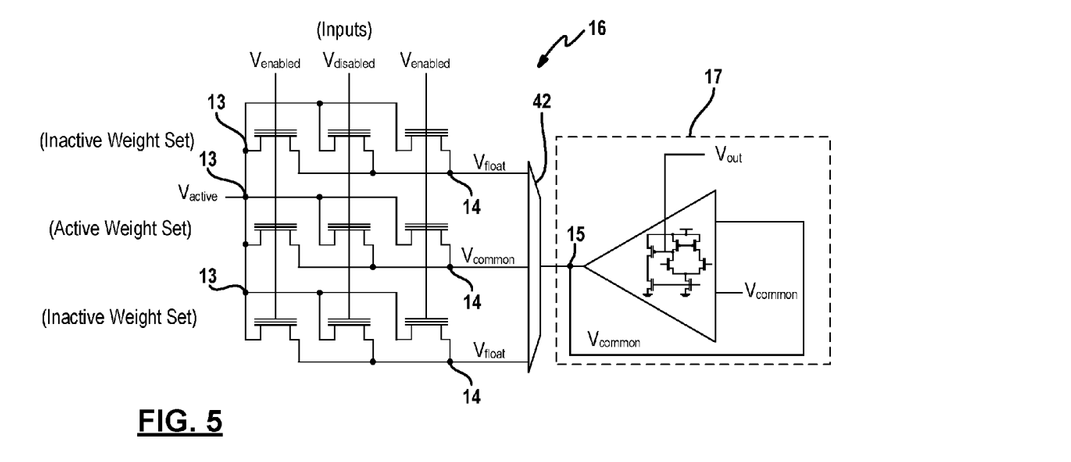
FIG. 5 is a schematic of an example embodiment of the weighted sum circuit arrangement in FIG. 1 implementing a multiplexer and a shared active line.

Lines from unselected weight sets (i.e., not connected to the output circuit) may be driven to $V_{common}$ to reduce leakage through the multiplexer as shown in FIG. 4, or may be permitted to float to $V_{float}$ as shown in FIG. 5. If the output circuit 17 includes separate terminals for monitoring the common line and for supplying the required current, then it may be desirable to use separate multiplexers for those two terminals so that the multiplexer connected to the monitoring terminal does not need to carry as much current and therefore does not develop as much of a voltage across it.

Figure 6:
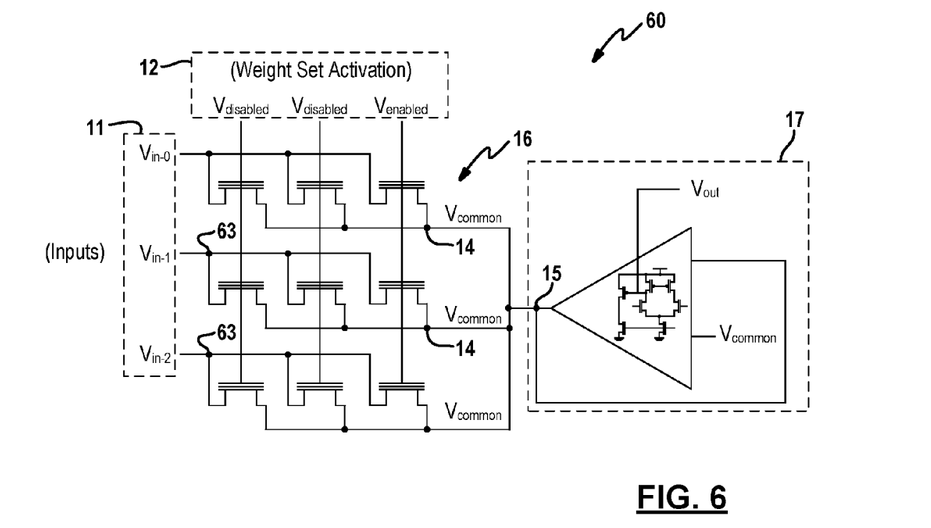
FIG. 6 is a schematic of another embodiment of a weighted sum circuit arrangement implementing real-valued inputs.

FIG. 6 depicts another example embodiment of the weighted sum circuit arrangement 60. In this embodiment, the weight sets are transposed from the arrangement shown in FIG. 1. In other words, the control circuit 12 is electrically connected to a control terminal of each transistor and operates to activate a given column of transistors (i.e., weight set); whereas, the input circuit 11 is electrically connected to the input node 63 for each row of transistors and operates to apply a voltage thereto. The real-value inputs can be designed to be interpreted each as [0, max], [−max, max], or a variety of other options depending on the application. By carefully choosing the voltages, a multiplication effect is achieved between the weights stored as threshold voltages and the input voltage applied thereto. It is noted that the actual input values are not applied as voltages, but rather the input values are mapped/transformed to the appropriate representative voltages in order to perform the calculation. The output similarly needs to be mapped/transformed. Because this variant allows inputs that represent real values (e.g., [−1, 1]), it is referred to as the "real-input" array design.

Figure 7:
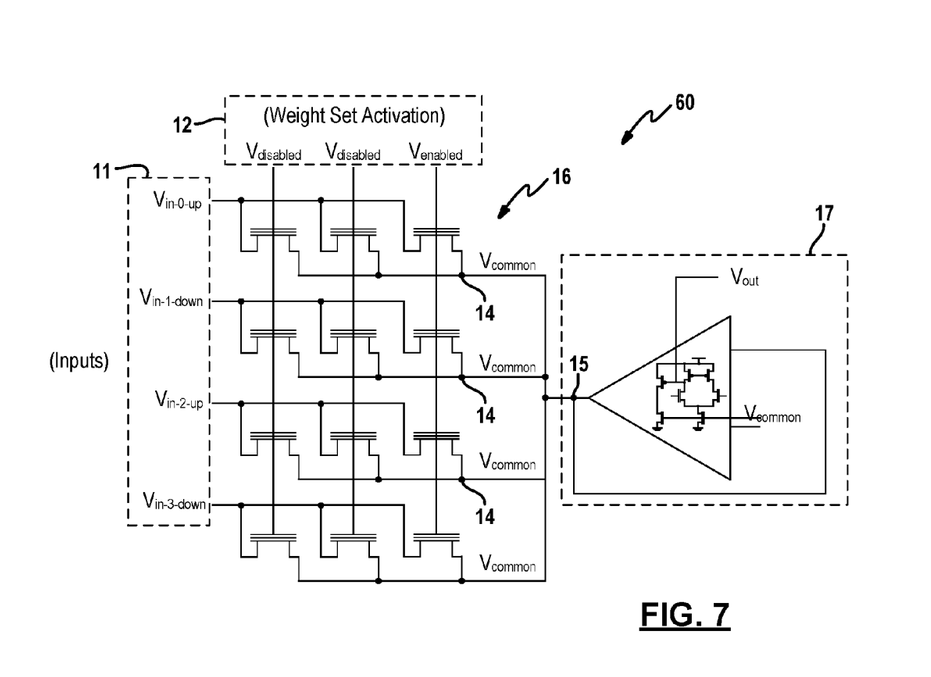
FIG. 7 is a schematic of the another embodiment of the weighted sum circuit arrangement of FIG. 6 implementing positive and negative weights.

To implement a negative weight, both the threshold voltage as well as the input voltage range may need to be adjusted to achieve the desired current. With reference to FIG. 7, the input voltage to positive weights (i.e., $V_{in-*-up}$) would be a voltage either greater than or less than $V_{common}$ while the input voltages to negative weights (i.e., $V_{in-*-down}$) would have input voltages with the opposite relationship. It may be desirable to adjust $V_{enabled}$ as well in order to adjust the current ranges for positive and negative weights, which would be more readily implemented in a second array (e.g., as shown in FIG. 3). It is understood that other variants described above in relation to binary input design shown in FIG. 1 also apply to the real input design shown in FIG. 6.

Figure 8:
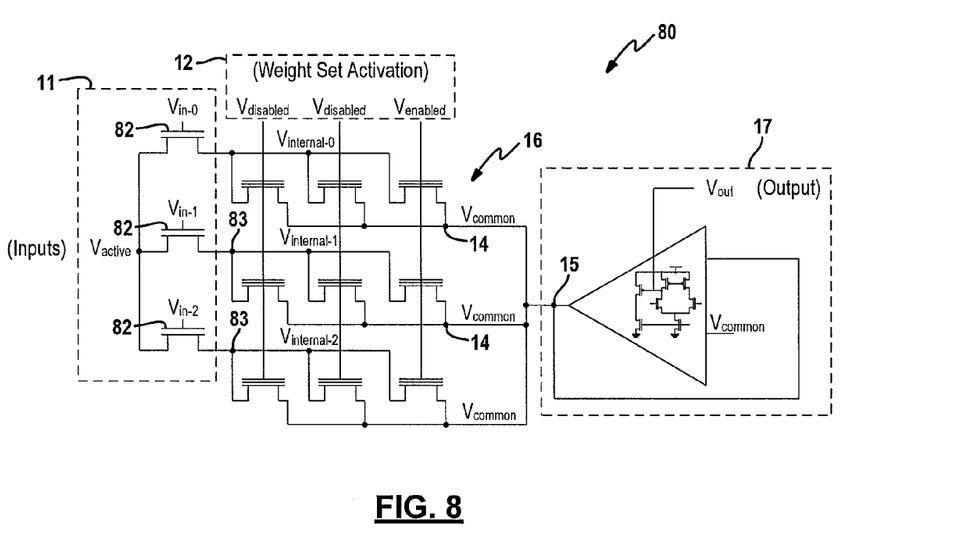
FIG. 8 is a schematic of yet another embodiment of the weighted sum circuit implemented using an additional input transistor.

FIG. 8 depicts yet another embodiment of the weighted sum circuit arrangement 80. In this embodiment, an extra input transistor 82 is position at each input node 83 between the input circuit 11 and the array of transistors 16. In one embodiment, the extra transistors are MOSFET transistors placed outside of the flash array, although other arrangements could be used as well, including using the already-present access transistors that are part of some floating-gate transistor implementations. The multiplication is performed across two devices—the input transistor 82 and the transistor currently selected in each row. The other side of the source/drain to the extra transistor is a single $V_{active}$ voltage that is shared among the array (or two can be used for "up" versus "down"). In this way, the design accepts a real-valued input, but does not require significant current draw on the input. This design is advantageous to the embodiment described in relation to FIG. 6 and FIG. 7 since each input goes to only a gate, which is easier to provide than an input that requires current. This design is referred to herein as the "capacitive-real-input" array design. That said, there are cases where either might be advantageous depending on technology and design constraints. As discussed below, there are also efficient ways to provide the inputs for the real-input array as well as the capacitive-real-input array of this design.

Transistors have three primary terminals: gate, source, and drain. The source and drain terminals are conditionally connected by a gate terminal, with the required gate voltage being defined by a "threshold voltage" for the transistor (note, the gate voltage is relative to the source terminal). This connection is traditionally viewed as on/off in digital circuit design, but is actually a function of the gate voltage, threshold voltage, and voltage between the source and drain. When a transistor is in 'triode', the formula drain-to-source current includes the multiplication of the gate-to-threshold voltage by the drain-to-source voltage. By putting the system to a well-defined voltage state, the combined transistors that hold one set of weights will pass current equal to the desired summed result.

A transistor is in triode-region operation when:

$$V_{DS} < V_{GS} - V_{th}$$

where $V_{DS}$ is the drain-to-source voltage, $V_{GS}$ is the gate-to-source voltage, and $V_{th}$ is the device threshold voltage. Triode-region current from the drain to the source is roughly estimated as:

$$I_D = \mu_n C_{ox} \frac{W}{L} \left[ (V_{GS} - V_{th}) V_{DS} - \frac{1}{2} V_{DS}^2 \right]$$

where $I_D$ is the drain current, $\mu_n$ is the transistor mobility constant, $C_{ox}$ is the transistor oxide thickness, W is the transistor width, and L is the transistor length. If $V_{DS}$ is kept relatively small, the $$\frac{1}{2} V_{DS}^2$$

term can be eliminated and the formula is rewritten as:

$$I_D \approx \mu_n C_{ox} \frac{W}{L} [(V_{GS} - V_{th}) V_{DS}]$$

The factors in front are all constants for a given array, so define:

$$\alpha = \mu_n C_{ox} \frac{W}{L}$$

and simplify the equation as:

$$I_D \approx \alpha (V_{GS} - V_{th}) V_{DS}$$

Flash transistors and floating-gate transistors (which may, in fact, be implemented via multiple transistors as mentioned above) allow $V_{th}$ to be adjusted by adding or removing charge from the floating-gate (charge receptacle). If the maximum and minimum threshold voltages are defined as $V_{th\_min}$ and $V_{th\_max}$, then looking at the simplified $I_D$ equation the current is maximized by $V_{th\_min}$ and minimized by $V_{th\_max}$. How these voltages are set and what numbers they represent are up to the circuit designer.

For example, for the binary-input arrays (such as the one shown in FIG. 1), one may set:

$$V_{active} = V_{th\_max} + V_{non-shared} V_{inactive} = 0$$

The minimum weight is 0, which is set by making $V_{th} = V_{th\_max}$ and the maximum weight is set by making $V_{th} = V_{th\_min}$. There is more flexibility in setting $V_{common}$, $V_{active}$, $V_{active-up}$, and $V_{active-down}$. These will need to be determined via experimentation with the exact transistors being used. However, the difference between $V_{common}$ and $V_{active}/V_{active-up}/V_{active-down}$ should be less than $V_{active} - V_{th\_min}$ in order to maintain triode-region operation.

In the case where both positive and negative weights/inputs are used, the difference between $V_{common}$ and $V_{active-up}$ versus the difference between $V_{common}$ and $V_{active-down}$ will likely need to be different, due to the body effect caused by one of the active voltages being greater than $V_{common}$. Similarly, the $V_{th}$ shift caused by the body affect may change what threshold voltage should be programmed in to achieve the same weight.

It is understood that other regions of operation other than the triode region may instead be used and still generate a desirable result, particularly with the binary-input array design which uses a constant $V_{DS}$. The chosen implementation of the voltages used will depend on the target application—the triode region assists in generating weights that have values near-zero.

Typically, when programming high-accuracy values (e.g., more than 2 bits of effective resolution) onto a floating-gate transistor, a feedback loop is used. In this process, a value is partially written and then read, in order to verify the progress of the write. This process is repeated until the desired value is written. Since writing threshold voltages for a single transistor is usually a one-way process by the nature of the technology (erase is usually array-wide), this is a process that errs on the side of caution by writing only a little bit at a time, or by writing an amount that is guaranteed to be less than or equal to the desired value.

While previous high-accuracy writing for floating-gate devices focused on threshold voltages, it is advantageous for the systems described herein to instead read the programmed current since that is what is being computing with. As the verification is performed, the system is set to the exact state, but with only one weight activated. That way, when computed, it is known that the value will be correct regardless of any non-idealities in the current equation. By following this procedure, a high-accuracy tunable current is achieved that can be enable/disable for computation, as described in earlier sections.

It is also possible to program subthreshold currents for the binary-input arrays and achieve the same calculation. In this case, the threshold voltage $V_{th}$ is greater than the gate voltage $V_{GS}$, however, since the source, gate, and drain voltages are all pre-determined, and the current drawn in subthreshold operation is still a function of $V_{th}$, proportional currents can be programmed to perform this calculation. The advantage is the reduced summing current during calculation, although this puts additional burden on the read-out circuitry.

For the real-input arrays, not only is a programmable range of currents desirable, but it is also desirable to take advantage of the multiplication effect in the triode-region $I_D$ equation. To accomplish this, the weights are activated by making the input be a source/drain voltage and the weight set selection be the gate voltage. The constraints are largely the same: $V_{enabled}$ is the same as before, and the relationships between $V_{active}/V_{in}$ and $V_{common}$ are the same. To get the real-valued input range of [0, 1], [0, max], [−1, 1], or [−max, max], each $V_{in}$ is varied. For an input value of 0, set $V_{in}$ equal to $V_{common}$, and to get increasing input values, increase the difference between $V_{in}$ and $V_{common}$.

Negative inputs and/or negative weights are achieved by changing the polarity of the difference between $V_{in}$ and $V_{common}$. Current will flow from the higher voltage to the lower voltage. If a weight and input are normally interpreted as positive when $V_{in}<V_{common}$, then to get a negative weight OR a negative input, we set $V_{in}>V_{common}$. If a negative weight AND a negative input, then keep $V_{in}<V_{common}$ since the minus signs cancel. Using this current equation it is also possible to perform additional calculation by varying the gate voltage $V_{GS}$. If $V_{GS}$ is reduced or increased it will subtract or add from the weight. The weight will have a lower bound of zero as it causes the device to shut off.

The capacitive-real-input array uses two transistor arrays and combines two $I_D$ equations, both in triode-region operation. Since the current through the two transistors must be equal, the intermediate node in, $V_{internal-*}$ shifts to make the two current equations equal, as shown below, where subscript "input" refers to the extra input transistor, and subscript "array" refers to the floating-gate array transistor:

$$I_D = \alpha_{input}(V_{GS-input} - V_{th-input})(V_{active} - V_{internal-a})$$
$$= \alpha_{array}(V_{GS-array} - V_{th-array})(V_{internal-a} - V_{common})$$

As either the input $V_{GS-input}$ or the threshold voltage $V_{th-array}$ is changed, the current will change linearly, completing the multiplication. $V_{internal-a}$ will shift to compensate.

Figure 9A:
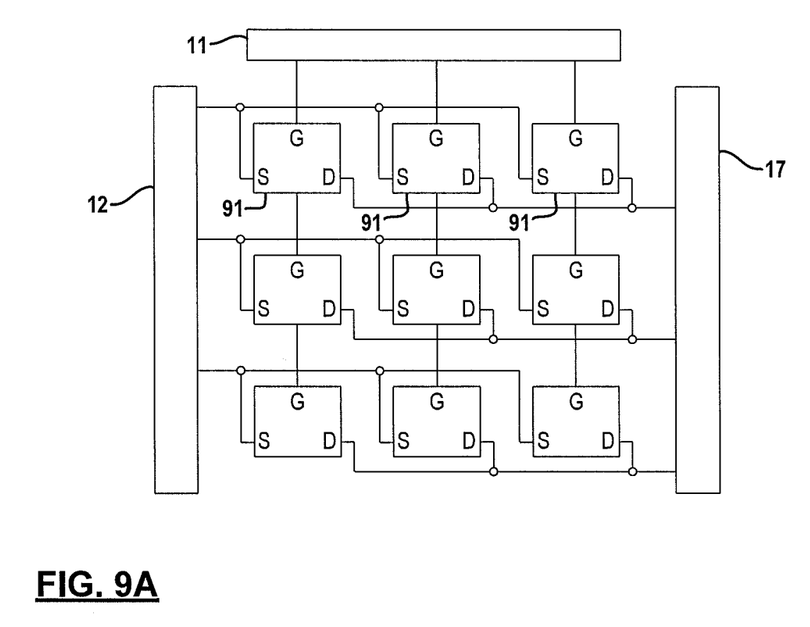
FIG. 9A is a block diagram of a weighted sum circuit arrangement having source lines and drain lines laid out horizontally.
Figure 9B:
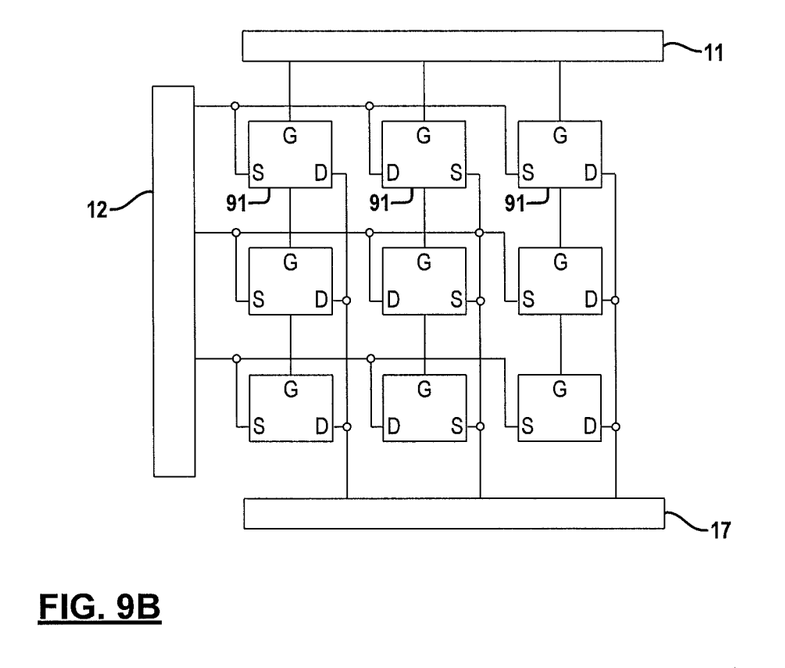
FIG. 9B is a block diagram of a weighted sum circuit arrangement having vertical drain lines.
Figure 9C:
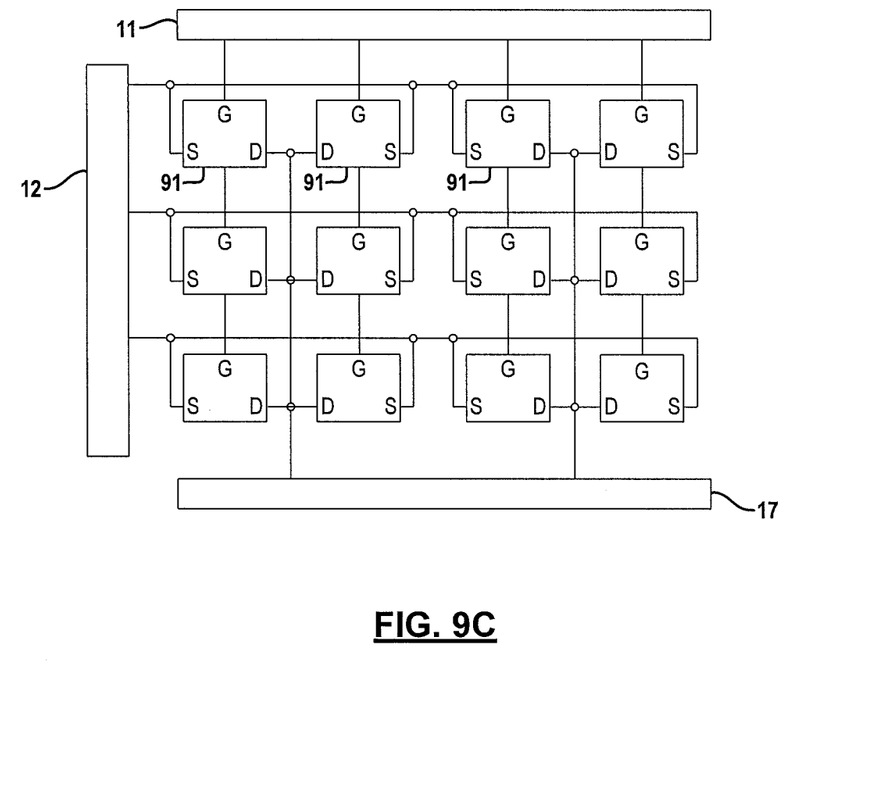
FIG. 9C is a block diagram of a weighted sum circuit arrangement having shared drain lines.
Figure 10A:
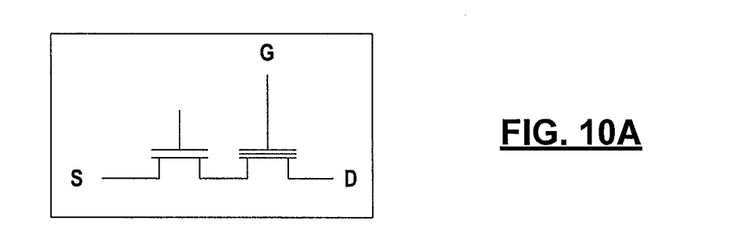
FIGS. 10A-10D are example implementations for a current source module which may be used in place of the floating-gate transistors.
Figure 10B:
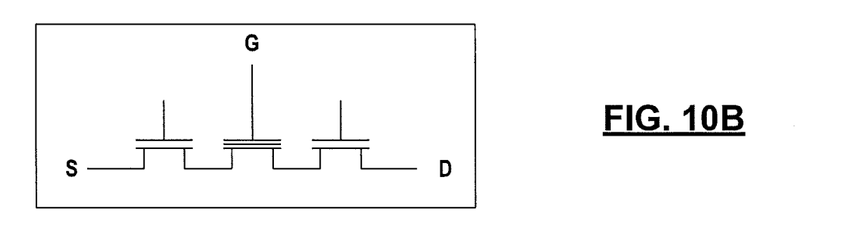
Figure 10C:
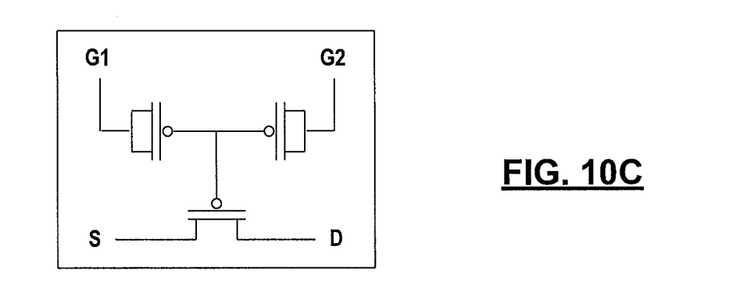
Figure 10D:
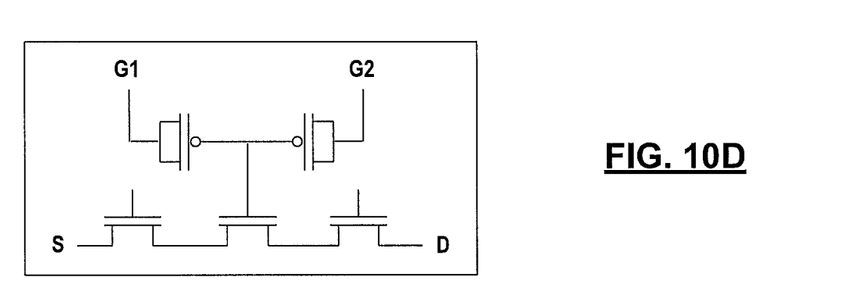

Floating-gate transistors set forth in the various embodiments described above may be replaced by other types of transistor arrangements which are referred to herein as current source modules. FIG. 9A depicts the weighted sum circuit 10 from FIG. 1 with current source modules 91 in place of the floating-gate transistors. A current source module 91 is defined generically as having a transistor, such as a field effect transistor, and a charge receptacle, where the charge receptacle is electrically isolated but capacitively coupled to a channel region of the field effect transistor. Example implementations for a current source module include but are not limited to a single transistor circuit arrangement, 2-transistor dual-poly embedded flash circuit (FIG. 10A), a 3-transistor dual-poly embedded flash circuit (FIG. 10B), a 3-transistor single-poly embedded flash circuit (FIG. 10C) or a 5-transistor single poly embedded flash circuit (FIG. 10D). Depending on the access strategy for adding and removing charge from the charge receptacle and the access strategy for selecting active devices, the current source module 91 may include additional control signals used in conjunction with the source, gate and drain terminals of the access transistor. These arrangements, amongst others, form a suitable replacement for the floating-gate transistor shown in the various embodiments described above. It is also envisioned that current source modules may be laid out with horizontal drain lines as shown in FIG. 9A, vertical drain lines as shown in FIG. 9B, or even with shared drain lines as shown in FIG. 9C. The drain line configuration may be restricted by the underlying process technology being used to implement the array, but if a decision can be made between horizontal and vertical drain lines, then these strategies have their own distinct advantages and disadvantages. The difference is related to the orientation of the weight sets, which are arranged horizontally for binary-input arrays, and vertically for real-input and capacitive-real-input arrays. In the case where the drain lines and weight sets have the same orientation, then each weight set has its own drain line and multiple weighted-sums can be calculated in parallel (up to one on each drain line). In the case where the weight sets and drain lines are oriented orthogonally, then multiple drain lines are needed for the same weighed sum calculation which precludes concurrent calculations which would use the same drain lines, but the effective cumulative resistance of the drain lines is lower since more than one is used in a given calculation. Using multiple drain lines for the same calculation also increases the capacitance of the line which reduces performance. Choosing between these options roughly simplifies down to performance versus accuracy. Arrangements having shared source lines and/or shared drain lines (as shown in FIG. 9C) are typically more compact and are also contemplated within the scope of this disclosure.

Figure 11:
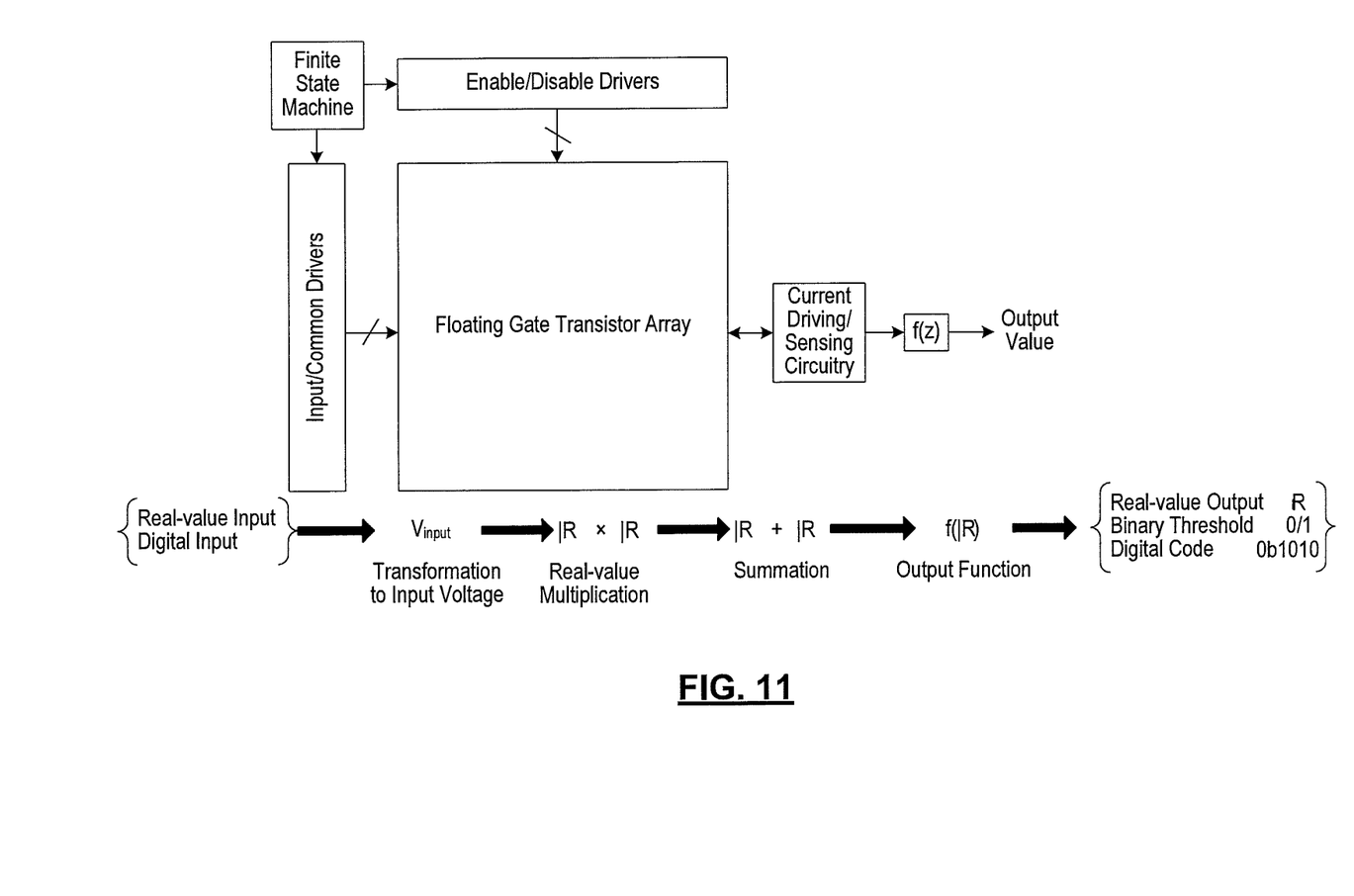
FIG. 11 is a diagram of the real-input circuit with peripheral circuits.

Weighted sum arrangements using a floating-gate transistor array need additional circuitry in order to operate as shown in FIG. 11. The output circuitry 17 needs to maintain $V_{common}$ on its output across the expected range of computational values. This circuit is readily implemented using an operational amplifier or operational transconductance amplifier. These circuits will have an internal node that swings in order to generate the change in output—it can be beneficial to choose a topology that has a wide swing, or one that can be easily translated to a readable voltage value. Additionally, the output will need to be read with a high degree of accuracy during the write procedure of floating-gate transistors, as described above. This can be accomplished by re-using the same output circuitry if the accuracy is high enough, augmenting the output circuitry in order to sometimes perform a high-accuracy read, or by having alternative output circuitry that is higher accuracy. If alternate output circuitry is used, it could possibly be shared between arrays, as could the normal output circuitry, as long as those arrays are not being read in parallel.

For arrays being used to implement neurons, an output function 110 may also be included. It can be part of the output circuitry or separate as shown in FIG. 11. For binary threshold, a simple comparator can be used. If the next stage can accept a digital code, an analog-to-digital converter may be used to read the output circuitry output voltage. If the next stage accepts a real-valued voltage, amplifiers may be used to generate a variety of functions, and may be used in combination with comparators to shape the value.

Providing the gate voltages for either array design or the activation voltages for the binary-input array requires only multiplexers controlled by a finite state machine 112.

There are a few options for generating the $V_{in}$ voltages for the real-input array, depending on power and energy constraints. The first is to use a sample and hold amplifier (SHA), which can store any real value, but requires circuitry to convert the real value to the correct voltage and requires an amplifier for every input. A SHA could also be used if the previous stage had a real-valued voltage output, as long as the voltage was properly mapped/transformed from the output to the next input. Another option would be to select or generate 1-of-N voltages depending on a digital input, where each digital code represents a real value going into the array. That circuitry also performs the transformation/mapping and possibly avoids an amplifier for each input.

Figure 12:
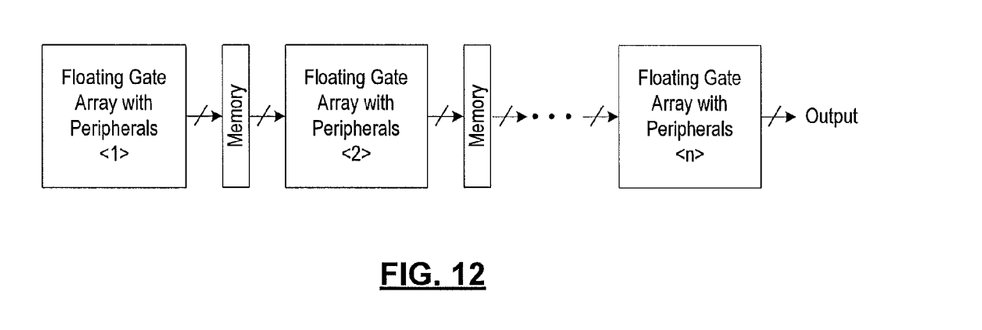
FIG. 12 is a diagram of a neural network system with multiple stages.

Once the array has the required peripheral circuitry, multiple arrays can be composed into a larger system as shown in FIG. 12. If not already included in the array, memories may need to be included in the system design between stages. In common neural network topologies there may be several stages. The arrays may implement convolutional neural network stages, fully connected stages, or non-fully connected stages. Recurrent neural networks can also be implemented using this computational style. The design is largely agnostic to the neural network or machine learning algorithm being implemented, since it is performing a base calculation used by many algorithms.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A weighted sum system, comprising:

an array of current source modules interconnected and arranged into rows and columns, where each current source module includes a field effect transistor and a charge receptacle electrically isolated but capacitively coupled to a channel region of the transistor, wherein, for each row of current source modules, one of a source terminal or a drain terminal for each current source module in the row of current source modules is electrically connected together at a select node and the other of the source terminal and the drain terminal for each current source module in the row of current source modules is electrically connected to one of a plurality of output nodes, such that current flowing through a given current source module is unaffected by operation of remainder of the current source modules in the array of current source modules;

a control circuit electrically connected to each current source module and operates to selectively activate a given column of current source modules in the array of current source modules;

an input circuit electrically connected to select node for each row of current source modules and operates to form a non-zero voltage across each current source module in a selected row of current source modules;

a set of input transistors interposed between the input circuit and the array of current source modules, for each input transistor, a gate terminal is electrically coupled to the input circuit, one of a source terminal or a drain terminal for each input transistor in the set of input transistors is electrically coupled together and the other of the source terminal and the drain terminal for each input transistor in the set of input transistors is electrically connected to one of select nodes in the array of current source modules; and an output circuit electrically connected to the plurality of output nodes via a common output node, the output circuit operates, substantially independently from amount of current that is being sourced, to maintain voltage at the common output node at a reference voltage and generates an output which is correlated to current that is being sourced collectively by the array of current source modules.

2. The weighted sum system of claim 1 wherein the input circuit selectively activates a given row of current source modules by forming a non-zero voltage across each current source module in the given row of current source modules.

3. The weighted sum system of claim 1 further comprises
a second array of current source modules interconnected and arranged into rows and columns, where each current source module in the second array of current source modules includes a field effect transistor and a charge receptacle electrically isolated but capacitively coupled to a channel region of the transistor, wherein, for each row of current source modules, one of a source terminal or a drain terminal for each current source module in the row of current source modules is electrically connected together at a secondary select node and the other of the source terminal and the drain terminal for each current source module in the row of current source modules is electrically connected to one of the plurality of output nodes, such that the current flowing through a given current source module in the second array of current source modules is unaffected by operation of remainder of the current source modules in the second array of current source modules; and
a second input circuit electrically connected to an input node for each row of current source modules in the second array of current source modules and operates to selectively activate a given row of current source modules in the second array of current source modules, where the control circuit selectively applies a voltage to the control nodes in the array of current source modules that causes current to flow through the current source modules away from the control node and the control circuit applies a voltage to the control nodes in the second array of current source modules that causes current to flow through the current source modules towards from the control node.

4. The weighted sum system of claim 1 wherein, for each row of current source modules, the other of a source terminal or a drain terminal for each current source module in the row of current source modules is electrically connected together at one output node in the plurality of output nodes.

5. The weighted sum system of claim 1 wherein, for each column of current source modules, the other of a source terminal or a drain terminal for each current source module in the column of current source modules is electrically connected together at one output node in the plurality of output nodes.

6. The weighted sum system of claim 1 wherein the output circuit is further defined as at least one of an operational amplifier or an operational transconductance amplifier.

7. The weighted sum system of claim 1 further comprises a multiplexer having a plurality of inputs and an output, such that inputs of the multiplexer are selectively coupled to the output nodes of each row of current source modules and the output of the multiplexer is electrically connected to the common output node.

8. A weighted sum system, comprising:
an array of current source modules interconnected and arranged into rows and columns, where each current source module includes a field effect transistor and a charge receptacle electrically isolated but capacitively coupled to a channel region of the transistor, wherein, for each row of current source modules, one of a source terminal or a drain terminal for each transistor in the row of current source modules is electrically connected together at a select node and the other of the source terminal and the drain terminal for each transistor in the row of current source modules is electrically connected to one of a plurality of output nodes, such that current flowing through a given current source module is unaffected by operation of remainder of the current source modules in the array of current source modules;
a control circuit electrically connected to each current source module and operates to selectively activate a given column of current source modules in the array of current source modules;
a set of input transistors electrically connected to select nodes in the array of current source modules, each input transistor in the set of input transistors has one of a source terminal or a drain terminal electrically coupled to one of select nodes in the array of current source modules;
an input circuit electrically connected to a gate terminal of each input transistor and operates to form a non-zero voltage across each current source module in a selected row of current source modules; and
an output circuit electrically connected to the plurality of output nodes via a common output node, the output circuit operates to maintain voltage constant at the common output node and generates an output which is correlated to current that is being sourced collectively by the array of current source modules.

9. The weighted sum system of claim 8 wherein the input circuit selectively activates a given row of current source modules by forming a non-zero voltage across each current source module in the given row of current source modules.

10. The weighted sum system of claim 8 further comprises
a second array of current source modules interconnected and arranged into rows and columns, where each current source module in the second array of current source modules includes a field effect transistor and a charge receptacle electrically isolated but capacitively coupled to a channel region of the transistor, wherein, for each row of current source modules, one of a source terminal or a drain terminal for each current source module in the row of current source modules is electrically connected together at a secondary select node and the other of the source terminal and the drain terminal for each current source module in the row of current source modules is electrically connected to one of the plurality of output nodes, such that current flowing through a given current source module in the second array of current source modules is unaffected by operation of remainder of the current source modules in the second array of current source modules; and
a second input circuit electrically connected to an input node for each row of current source modules in the second array of current source modules and operates to selectively activate a given row of current source modules in the second array of current source modules, where the control circuit selectively applies a voltage to the control nodes in the array of current source modules that causes current to flow through the current source modules away from the control node and the second control circuit applies a voltage to the control nodes in the second array of current source modules that causes current to flow through the current source modules towards from the control node.

11. The weighted sum system of claim 8 wherein, for each row of current source modules, the other of a source terminal or a drain terminal for each current source module in the row of current source modules is electrically connected together at one output node in the plurality of output nodes.

12. The weighted sum system of claim 8 wherein, for each column of current source modules, the other of a source terminal or a drain terminal for each current source module in the column of current source modules is electrically connected together at one output node in the plurality of output nodes.

* * * * *

UNITED STATES PATENT AND TRADEMARK OFFICE
CERTIFICATE OF CORRECTION

PATENT NO. : 9,760,533 B2
APPLICATION NO. : 14/459577
DATED : September 12, 2017
INVENTOR(S) : Laura E. Fick et al.

Page 1 of 1

It is certified that error appears in the above-identified patent and that said Letters Patent is hereby corrected as shown below:

On the Title Page

Column 1, (73) Assignee, Line 1, delete "ON" and insert --OF-- therefor

Column 1, (73) Assignee, Line 3, after "(US)", insert --; Isocline Engineering, LLC, Ann Arbor, MI (US)--

Signed and Sealed this
Twentieth Day of February, 2018

Andrei Iancu
*Director of the United States Patent and Trademark Office*